United States Patent
Lim et al.

(10) Patent No.: US 11,169,318 B2
(45) Date of Patent: Nov. 9, 2021

(54) LIGHTING DEVICE

(71) Applicant: LG INNOTEK CO., LTD., Seoul (KR)

(72) Inventors: Eay Jin Lim, Seoul (KR); Dong Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/074,061

(22) Filed: Oct. 19, 2020

(65) Prior Publication Data

US 2021/0063631 A1    Mar. 4, 2021

Related U.S. Application Data

(63) Continuation of application No. 16/346,996, filed as application No. PCT/KR2017/012418 on Nov. 3, 2017, now Pat. No. 10,845,528.

(30) Foreign Application Priority Data

Nov. 4, 2016 (KR) .................. 10-2016-0146660
Jan. 9, 2017 (KR) .................. 10-2017-0002977

(51) Int. Cl.
*F21V 8/00* (2006.01)
*H01L 33/58* (2010.01)
(Continued)

(52) U.S. Cl.
CPC .............. *G02B 6/0055* (2013.01); *F21K 9/60* (2016.08); *F21K 9/61* (2016.08); *F21K 9/68* (2016.08);
(Continued)

(58) Field of Classification Search
None
See application file for complete search history.

(56) References Cited

U.S. PATENT DOCUMENTS

2007/0253218 A1‡ 11/2007 Tanabe ................. G02B 6/0068
                                                                362/612
2009/0154186 A1‡  6/2009 Natsume ............... F21S 43/247
                                                                362/51
(Continued)

FOREIGN PATENT DOCUMENTS

CN        101457892 A    6/2009
CN        104566008 A    4/2015
(Continued)

OTHER PUBLICATIONS

International Search Report dated Feb. 2, 2018 issued in Application No. PCT/KR2017/012418.
(Continued)

*Primary Examiner* — Vip Patel
(74) *Attorney, Agent, or Firm* — Ked & Associates, LLP

(57) ABSTRACT

Disclosed in an embodiment is a lighting device comprising: a light conversion module including one surface and the other surface; and a light source module disposed at a side surface of the light conversion module, wherein the light source module comprises a plurality of light emitting elements disposed so as to be spaced in a first direction, the first direction is a thickness direction of the light conversion module, and at least one among the plurality of light emitting elements is disposed higher than the one surface of the light conversion module in the first direction.

20 Claims, 15 Drawing Sheets

(51) Int. Cl.
    *F21K 9/60*           (2016.01)
    *F21V 7/00*           (2006.01)
    *F21S 2/00*           (2016.01)
    *F21K 9/68*           (2016.01)
    *F21K 9/61*           (2016.01)
    *F21K 9/69*           (2016.01)
    *G02B 30/00*         (2020.01)

(52) U.S. Cl.
    CPC ............... *F21K 9/69* (2016.08); *F21S 2/00* (2013.01); *F21V 7/00* (2013.01); *G02B 6/0031* (2013.01); *G02B 6/0038* (2013.01); *G02B 6/0068* (2013.01); *G02B 30/00* (2020.01); *H01L 33/58* (2013.01)

(56) References Cited

U.S. PATENT DOCUMENTS

| | | | |
|---|---|---|---|
| 2014/0321163 A1‡ | 10/2014 | Kao | G02B 6/0053 362/61 |
| 2015/0116980 A1‡ | 4/2015 | Li | F21S 41/153 362/84 |
| 2016/0146420 A1‡ | 5/2016 | Yang | F21S 43/50 362/51 |
| 2017/0052289 A1‡ | 2/2017 | Boissevain | H05B 47/105 |

FOREIGN PATENT DOCUMENTS

| | | |
|---|---|---|
| EP | 2 492 585 | 8/2012 |
| JP | 2010-009785 | 1/2010 |
| JP | 2012-014871 | 1/2012 |
| JP | 2013-191338 | 9/2013 |
| JP | 2014-160581 | 9/2014 |
| JP | 2014-192000 | 10/2014 |
| KR | 10-2008-0102099 | 11/2008 |
| KR | 10-2013-0075024 | 7/2013 |
| WO | WO 2013/183227 A1 | 12/2013 |
| WO | WO 2015/121352 | 8/2015 |

OTHER PUBLICATIONS

European Search Report dated Sep. 30, 2019 issued in Application No. 17866815.8.
Office Action dated Mar. 30, 2020 issued in parent U.S. Appl. No. 16/346,996.
Chinese Office Action dated Mar. 18, 2020 issued in Application 201780068193.6.

‡ imported from a related application

LIGHTING DEVICE

CROSS-REFERENCE TO RELATED APPLICATIONS

This application is a Continuation Application of U.S. patent application Ser. No. 16/346,996 filed May 2, 2019, which is a U.S. National Stage Application under 35 U.S.C. § 371 of PCT Application No. PCT/KR2017/012418, filed Nov. 3, 2017, which claims priority to Korean Patent Application No's. 10-2016-0146660, filed Nov. 4, 2016 and 10-2017-0002977, filed Jan. 9, 2017, whose entire disclosures are hereby incorporated by reference.

BACKGROUND

1. Field

An embodiment relates to a lighting device configured to implement linear light.

2. Background

Generally, a lighting device is a device configured to illuminate a dark place using various light sources. The lighting device is also used to light a particular object or place and express an atmosphere in a desired shape or color.

Recently, due to development of a light emitting diode (LED) technology, various types of lighting devices using an LED are spreading. For example, conventional lighting devices include an LED light source and a diffusion plate configured to diffuse light emitted from the LED light source to emit the light to the outside.

Most of the conventional lighting devices are configured to emit uniform light to an entire light emitting surface. Further, in order to express an atmosphere in a desired shape or color, some of the conventional lighting devices use color filters or filters each having a desired-shaped light transmission port.

However, when the atmosphere is expressed in the desired shape or color using the conventional lighting device, the configuration of the device becomes mechanically complicated, and accordingly, a design freedom degree of a desired shape is limited and installation or operation is difficult. As described above, a lighting device which has a simple structure and is convenient to install or operate is demanded to express an atmosphere with a desired shape or color or an optical image.

Further, in some conventional technologies, a lighting device having an improved surface light emitting performance by adding an optical sheet such as a diffusion sheet, a prism sheet, a protection sheet, or the like on a light guide plate is proposed.

However, the conventional lighting device using the LED light source has a limitation in reducing an overall thickness of a product due to a thickness of a light guide plate itself. Further, a material of the light guide plate is not flexible and thus is difficult to apply to a refracted housing or application. In addition, it has a disadvantage that product design and design modification are not easy due to the light guide plate.

Accordingly, a method which can be easily applied to various applied products such as indoor and outdoor lighting, vehicle lighting, or the like and can efficiently implement a desired optical image is in demand.

BRIEF DESCRIPTION OF THE DRAWINGS

The embodiments will be described in detail with reference to the following drawings in which like reference numerals refer to like elements wherein.

DETAILED DESCRIPTION

The embodiments may be modified into other forms or some of the embodiments may be combined, and the scope of the present invention is not limited to embodiments which will be described below.

Although items described in a specific embodiment are not described in another embodiment, the items may be understood as a description related to the other embodiment unless a description opposite or contradictory to the items is in the other embodiment.

For example, when a characteristic of a configuration A is described in a specific embodiment and a characteristic of a configuration B is described in another embodiment, the characteristics of the configurations are understood to fall in the scope of the present invention unless an opposite or contradictory description is present even when an embodiment in which the configuration A and the configuration B are combined is not clearly disclosed.

In the description of the embodiments, when one element is disclosed to be formed "on or under" another element, the term "on or under" includes both a case in which the two elements are in direct contact with each other and a case in which at least another element is disposed between the two elements (indirectly) to be formed. Further, when the term "on or under" is expressed, a meaning of an upward direction and a downward direction with respect to one element may also be included.

Hereinafter, embodiments of the present invention will be described in detail with reference to the accompanying drawings so that those skilled in the art may easily perform the embodiment of the present invention.

Figure 1:
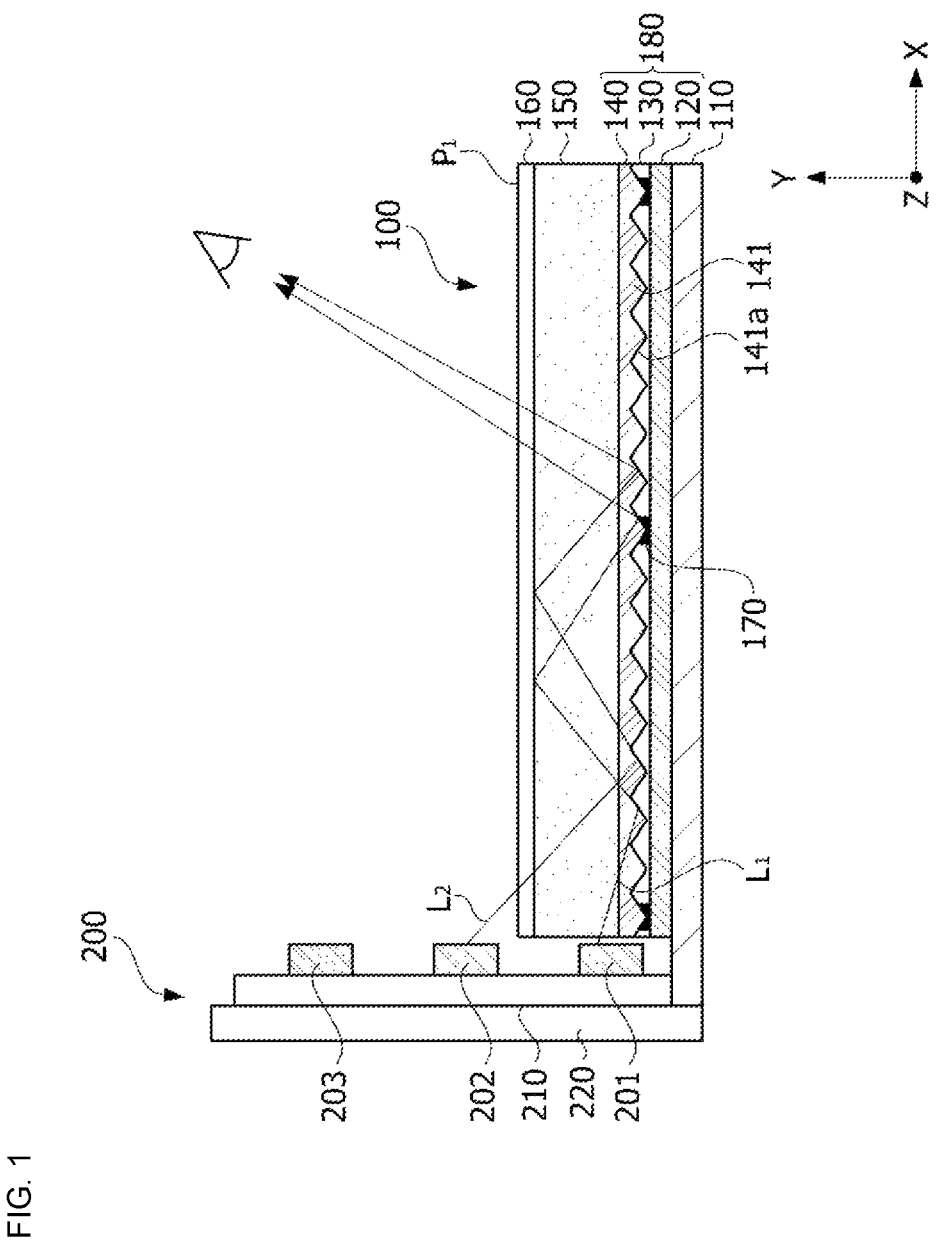
FIG. 1 is a conceptual diagram of a lighting device according to an embodiment of the present invention.
Figure 2A:
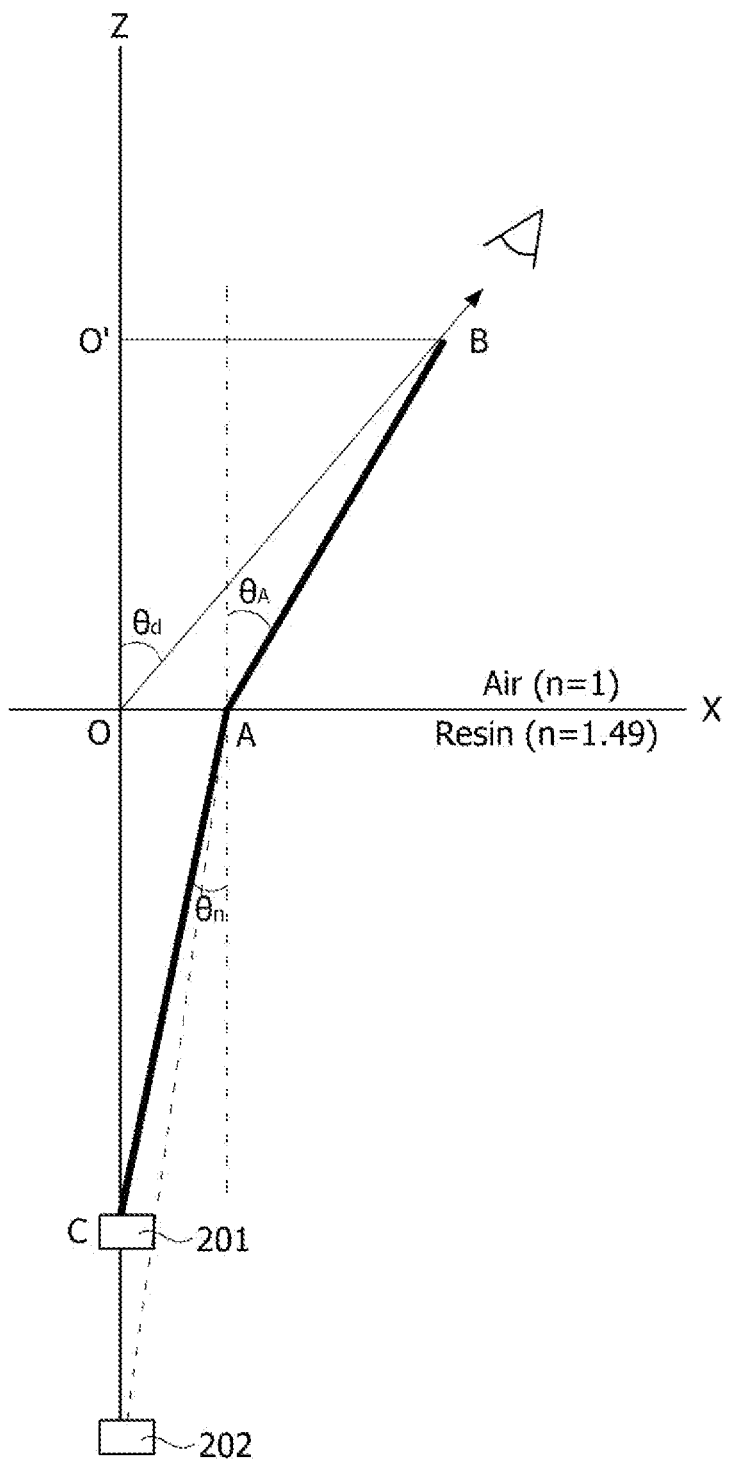
FIG. 2A is a view for describing a principle of bending of light according to a height of a light emitting element.
Figure 2B:
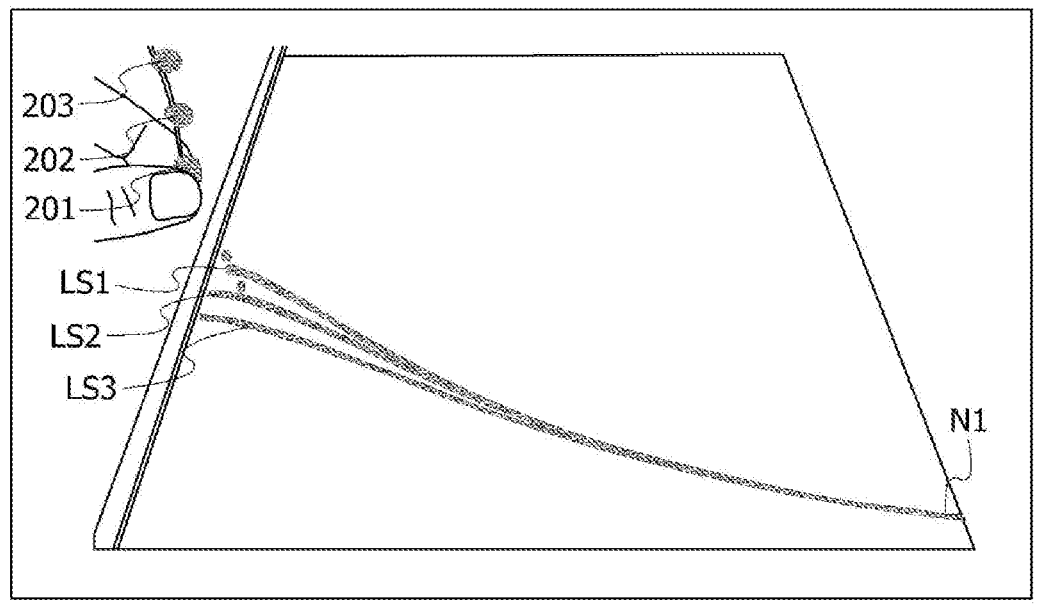
FIG. 2B is a picture illustrating linear light emitted from light emitting elements having different heights.

FIG. 1 is a conceptual diagram of a lighting device according to an embodiment of the present invention, FIG. 2A is a view for describing a principle of bending of light according to a height of a light emitting element, and FIG. 2B is a picture illustrating linear light emitted from light emitting elements having different heights.

Referring to FIG. 1, the lighting device according to the embodiment includes a light conversion module 100 including one surface P1 and another surface and a light source module 200 disposed on a side surface of the light conversion module 100.

The light source module 200 includes a circuit board 210 and a plurality of light emitting elements 201, 202, and 203 disposed to be spaced apart from each other in a first direction (a Y direction). The circuit board 210 may be disposed on the side surface of the light conversion module 100 and extend in the first direction. The plurality of light emitting elements 201, 202, and 203 may be disposed to be spaced apart from each other along the first direction. Here, the first direction may be a thickness direction of the light conversion module 100 or a direction which crosses a plane.

Although an example in which the light source module 200 and the light conversion module 100 are disposed to be perpendicular to each other is described in FIG. 1, the present invention is not necessarily limited thereto. For example, the light source module 200 and the light conversion module 100 may be disposed so that an angle between the light source module 200 and the light conversion module 100 may be less than 90°. That is, the angle may be appropriately adjusted so that light emitted from a light source of the light source module 200 may be incident on the light conversion module 100 to be observed by an observer.

A separation distance of the plurality of light emitting elements 201, 202, and 203 is not particularly limited. For example, a separation distance of the plurality of light emitting elements 201, 202, and 203 in the first direction may be 5 to 50 mm. An interval of the linear light becomes too small and thus a cubic effect is difficult to feel when the separation distance is less than or equal to 5 mm, and the interval increases too much and thus a stereoscopic image may be difficult to uniformly implement when the separation distance is greater than 50 mm.

According to the embodiment, at least one of the plurality of light emitting elements 201, 202, and 203 may be disposed higher than the one surface P1 of the light conversion module 100 in the first direction.

Further, at least one of the plurality of light emitting elements 201, 202, and 203 may be disposed to face the one surface of the light conversion module 100.

For example, a first light emitting element 201 disposed at a bottom may be disposed to face the side surface of the light conversion module 100, and a second light emitting element 202 and a third light emitting element 203 may be disposed higher than the light conversion module 100 in the first direction.

Light L1 emitted from the first light emitting element 201 may be incident on the side surface of the light conversion module 100. On the other hand, light L2 emitted from the second light emitting element 202 and the third light emitting element 203 may be incident on the one surface P1 of the light conversion module 100.

The light L2 emitted from the second light emitting element 202 and the third light emitting element 203 may be longer than the first light emitting element 201 by a distance at which the light L2 is incident on an upper surface of the light conversion module. That is, as the light emitting elements are disposed to be higher, the length of an optical path increases.

The light conversion module 100 includes a first base substrate 110, a light guide layer 150 disposed on the first base substrate 110, and a reflection pattern layer 180 disposed between the first base substrate 110 and the light guide layer 150.

The first base substrate 110 may be a substrate having a predetermined thickness. The first base substrate 110 may be a substrate configured to support the light conversion module 100. The first base substrate 110 may be made of a plastic material but is not necessarily limited thereto. The first base substrate 110 may be a bracket.

The light guide layer 150 may include a transparent base material. The light guide layer 150 may include a plate-shaped or film-shaped transparent member having a haze of 2% or less. Further, a light transmission rate of the light guide layer 150 may be greater than or equal to 80% but is not limited thereto.

The light transmission rate of the light guide layer 150 may be selected to be about 60% or more according to an optical image having a desired-shaped linear light or a stereoscopic effect when linear light, stereoscopic light, or stereoscopic linear light is implemented. When the light transmission rate of the light guide layer 150 is less than 60%, the linear light or the stereoscopic light may be difficult to appropriately show.

The light guide layer 150 may have one surface and another surface. When the light guide layer 150 is a plate or a film, the one surface and another surface may have two surfaces each having a relatively greater area in comparison with other surfaces of the light guide layer 150 and approximately parallel to each other. The one surface may be a light emitting surface from which light is emitted.

The light guide layer 150 may include glass, resin, or the like. A thermoplastic polymer, a light curable polymer, or the like may be used as a material of the light guide layer 150. Specifically, the material of the light guide layer 150 may be polycarbonate, polymethylmethacrylate, polystyrene, polyethylene terephthalate, or the like but is not limited thereto.

A thickness of the light guide layer 150 may be in a range of 100 um to 250 um. In this case, the light guide layer 150 may have a flexibility suitable to be appropriately wound around a rolling device. Further, thickness of the light guide layer 150 may be in a range of 250 um to 10 mm according to implementation. In this case, the light guide layer 150 is difficult to wind around the rolling device and thus may be applied to an applied product by having a plate shape. A protection layer may be disposed on the light guide layer 150. The protection layer may be a polyethylene terephthalate (PET) film.

The reflection pattern layer 180 may include a reflection layer 120 disposed between the first base substrate 110 and the light guide layer 150 and an optical layer 140 disposed between the reflection layer 120 and the light guide layer 150 and including a plurality of patterns 141 configured to protrude toward the reflection layer 120. In this case, a separation part 130 may be formed between the reflection layer 120 and the optical layer 140. The separation part 130 may be defined as a vacant space excluding a space in which an adhesive layer 170 is disposed. The reflection efficiency of light which is incident may increase due to the separation part 130, and the linear light having a depth sense may be advantageous to implement.

The reflection layer 120 may be a coating layer or a reflection film. In the embodiment, the reflection layer 120 may be a flat reflection film but is not necessarily limited thereto.

When the reflection layer 120 is used, light reflected and refracted by the plurality of patterns 141 of the optical layer 140 which will be described below to pass through the one surface of the light guide layer 150 and then proceed to the outside of the light guide layer 150 may be reflected to be reflected into the light guide layer 150 again.

According to the configuration, an optical image of linear light or stereoscopic linear light desired to be expressed through the optical layer 140 may be changed to more clearly express the optical image.

When the reflection layer 120 is disposed, an interval of the separation part 130 may be designed to be greater than zero and less than or equal to several micrometers. The above is provided to prevent a case in which the linear light or the stereoscopic linear light is difficult to implement from the optical layer 140 due to undesirable light scattering at the separation part 130. Of course, the reflection layer 120 may be disposed close to another surface of the light guide layer 150 to omit the separation part 130 according to the implementation.

The reflection pattern layer 180 may include a plurality of patterns 141 arranged in a third direction (an X direction), and the plurality of patterns 141 may extend in a direction (a Z direction) perpendicular to a proceeding direction of light emitted from the plurality of light emitting elements 201, 202, and 203. Accordingly, the incident light may be reflected in an upward direction by the perpendicular patterns 141 to implement continuous linear light (line-shaped light) in the third direction.

The plurality of patterns 141 may be convexly formed toward the reflection layer 120a and have inclined surfaces 141a. The inclined surfaces 141a of the patterns 141 may sequentially emit the incident light reflected from the inside of the light guide layer 150 to the outside of the light guide layer 150.

The inclined surface 141a may limit diffused reflection of the incident light and control the incident light so that the incident light may hardly return to an incident angle. That is, the inclined surface 141a may guide the incident light in a predetermined direction by refraction and regular reflection of the incident light.

In the embodiment, the plurality of patterns 141 are described as being formed on a separate optical layer 140 but are not limited thereto and may be directly formed on another surface of the light guide layer 150.

Further, the patterns 141 of the optical layer 140 may protrude toward the light guide layer 150, and the reflection layer 120 may be disposed between the optical layer 140 and the light guide layer 150. Accordingly, the reflection layer 120 may have a a concavo-convex shape along the patterns 141.

According to the above-described configuration, light (incident light) which moves in the light guide layer 150 may be reflected and refracted by the plurality of patterns 141 of the optical layer 140, and the lighting device may implement linear light (line-shaped light) of a first path orthogonal to extending directions of the plurality of patterns 141 by the guide light.

The light that meets the inclined surface 141a of each of the patterns 141 of the optical layer 140 is refracted or reflected according to the incident angle thereof. That is, when the incident angle is less than a critical angle θc, light which passes through the light guide layer 150 is refracted according to a difference of a refraction index to proceed while passing through the one surface or the patterns 141. Further, the light which passes through the light guide layer 150 is reflected from the one surface or the inclined surfaces 141a of the patterns 141 when the incident angle is greater than or equal to the critical angle θc.

Accordingly, when the plurality of patterns 141 sequentially arranged and having the inclined surfaces 141a are used, the linear light or the stereoscopic linear light may be expressed on the optical layer 140. When the extending directions of the plurality of patterns 141 are designed in a desired direction, an optical path of the incident light which passes through the optical layer 140 is limited to a path perpendicular to the extending direction of each of the patterns 141 (a first path) and it is possible to induce sequential emission of the incident light on the first path in a direction of the first surface, and thus width and luminous intensity of the incident light may be controlled in a desired shape.

Here, the linear light may refer to a beam in which the light of the first path appears relatively more clearly than light at a surrounding area according to the location of a reference point or an observation point.

The extending direction of the pattern (the Z direction) is a direction in which a particular straight line on the inclined surface 141a extends or a direction in which a particular tangent line which comes into contact with a curved line on the inclined surface 141a extends. The extending direction of the pattern is designed to limit and guide an optical path of the light emitted from the light source which shines light onto the plurality of patterns 141 to a desired direction, that is, the first path. That is, the extending directions of the inclined surfaces 141a of the patterns 141 are provided to be approximately parallel to an arranging surface of the patterns and extend in a direction orthogonal to the first path.

Referring to FIGS. 1 and 2A, the light emitted from the light emitting elements is refracted by a difference of refraction indexes between the light guide layer 150 and air. Here, θA is an angle in which the light emitted from the light guide layer is incident on a detector, θd is an angle between a center of the module and the detector, θn is a light refraction angle in the light guide layer, OC is a distance from the light source to the center of the module, and OA is a distance from the center of the module to a point at which the light is emitted to the air.

In this case, the light emitted from the second light emitting element 202 disposed on the light conversion module 100 has an optical path AC greater than that of the light emitted from the first light emitting element 201 disposed at the side surface of the light conversion module 100. Accordingly, since the light emitted from the second light emitting element 202 and the third light emitting element 203 has a relatively smaller θn, the bending decreases.

Referring to FIG. 2B, the bending of the linear light decreases as the light emitting element is disposed higher from the upper surface of the light conversion module 100. For example, first linear light LS1 emitted from the first light emitting element 201 disposed at the side surface of the light conversion module may be bent the most. Second linear light LS2 emitted from the second light emitting element 202 disposed on the light conversion module is bent less than the first linear light LS1. Further, third linear light LS3 emitted from the third light emitting element 203 which is disposed at the highest level is bent the least. In this case, ends N1 of the first linear light LS1, the second linear light LS2, and the third linear light LS3 may meet with each other. Accordingly, heights of the light emitting elements are adjusted to implement linear light having various curvatures using the above.

Figure 3A:
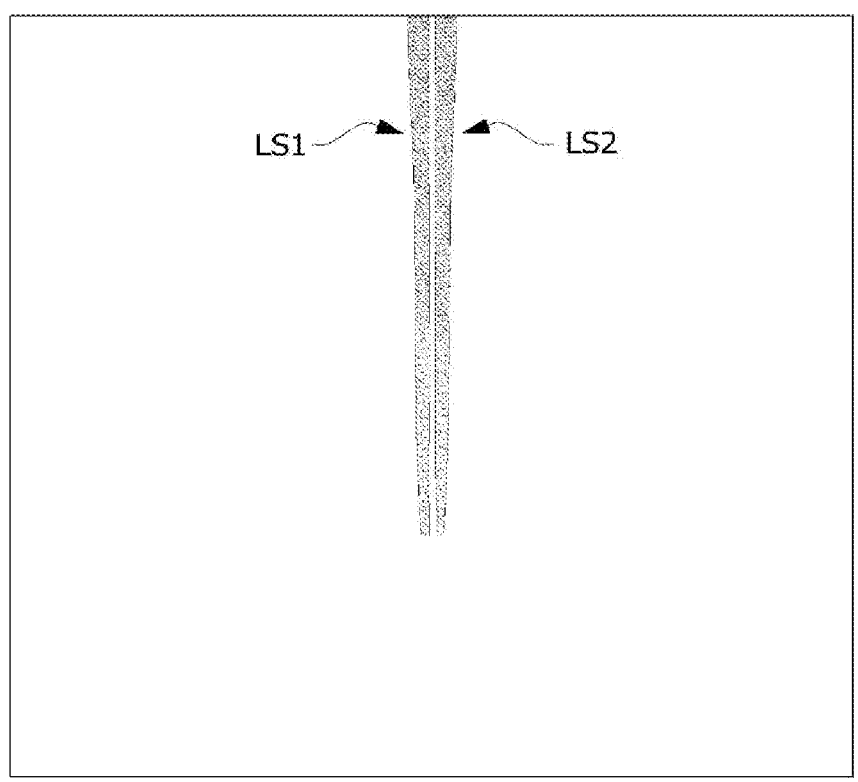
FIG. 3A is a picture of light emitted from two light emitting elements having different heights viewed from the front.

FIG. 3A is a picture of the light emitted from two light emitting elements having the different heights viewed from a front, FIG. 3A is a picture of the light emitted from two light emitting elements having the different heights viewed from a 60° angle, and FIG. 3A is a picture of the light emitted from two light emitting elements having the different heights viewed from a 75° angle.

Referring to FIG. 3A, in the case in which the first light emitting element 201 is disposed at the side surface of the light conversion module 100 and the second light emitting element 202 is disposed higher than the first light emitting element 201 by 10 mm, the light 1 emitted from the first light emitting element 201 and the light 2 emitted from the second light emitting element 202 may located at almost the same location when observed from the front.

Figure 3B:
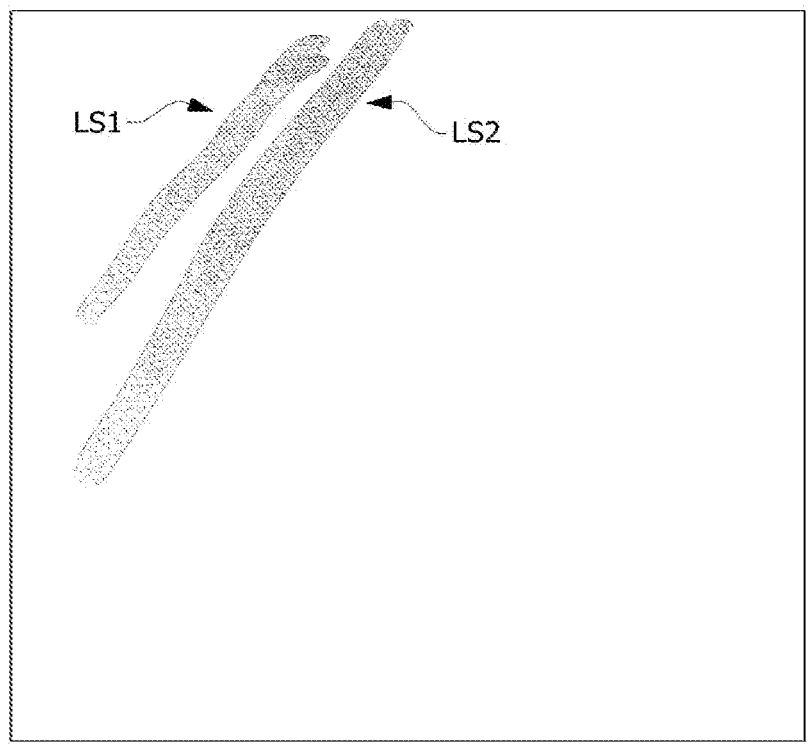
FIG. 3B is a picture of light emitted from two light emitting elements having different heights viewed from a 60° angle.
Figure 3C:
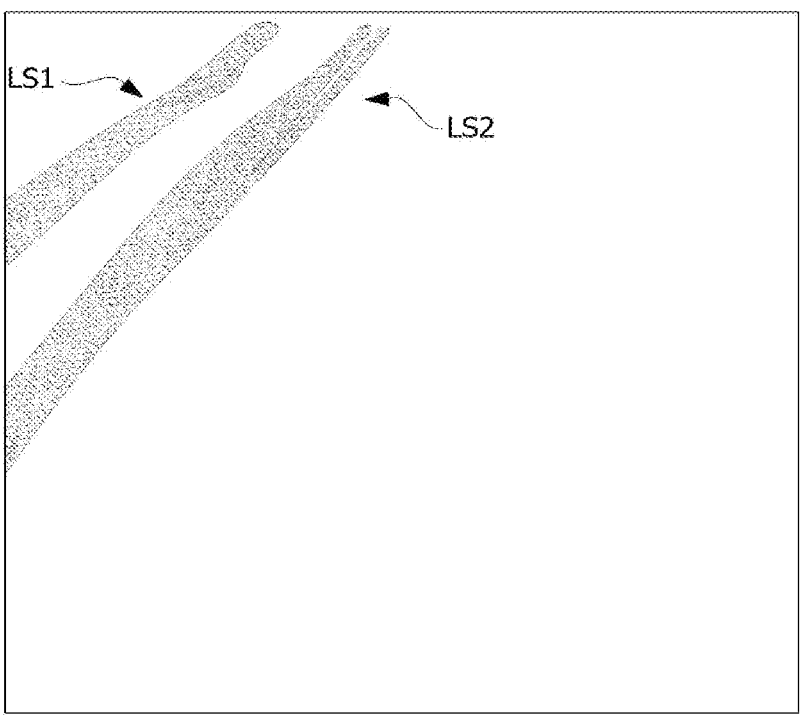
FIG. 3C is a picture of light emitted from two light emitting elements having different heights viewed from a 75° angle.

However, as shown in FIGS. 3B and 3C, when viewed from the side, it is confirmed that the second linear light LS2 emitted from the second light emitting element 202 is greatly bent according to an observer's eye, and an inclination angle of the first linear light LS1 emitted from the first light emitting element 201 has a limited value of about 42° according to a refraction index of resin. That is, it is confirmed that bending of the first linear light LS1 is greater at a predetermined angle (about 42°) or less as shown in FIG. 2B when the light emitting elements are disposed higher than the light conversion module 100, but a bending angle of the second linear light LS2 is greater when observed at an angle inclined by a predetermined angle or more.

Figure 4:
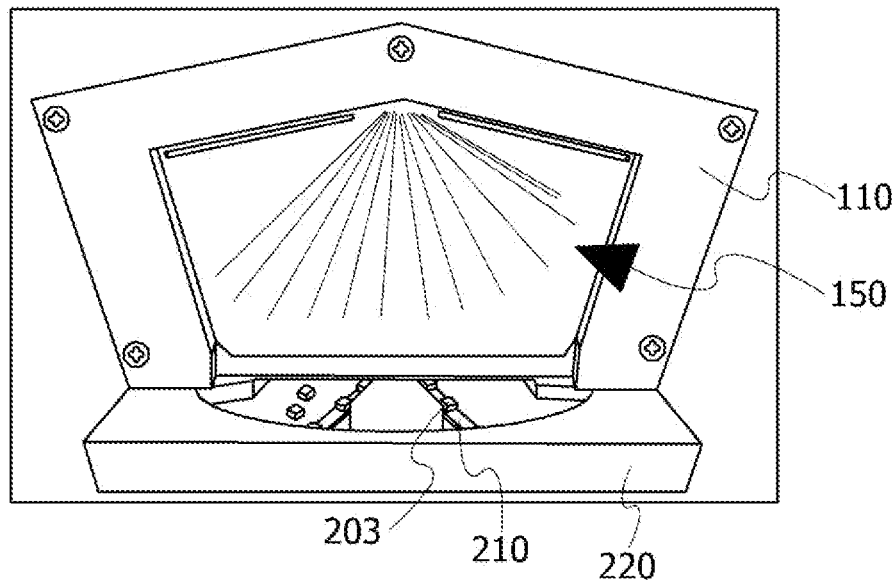
FIG. 4 is a picture of the lighting device according to the embodiment of the present invention viewed from the front thereof.
Figure 5:
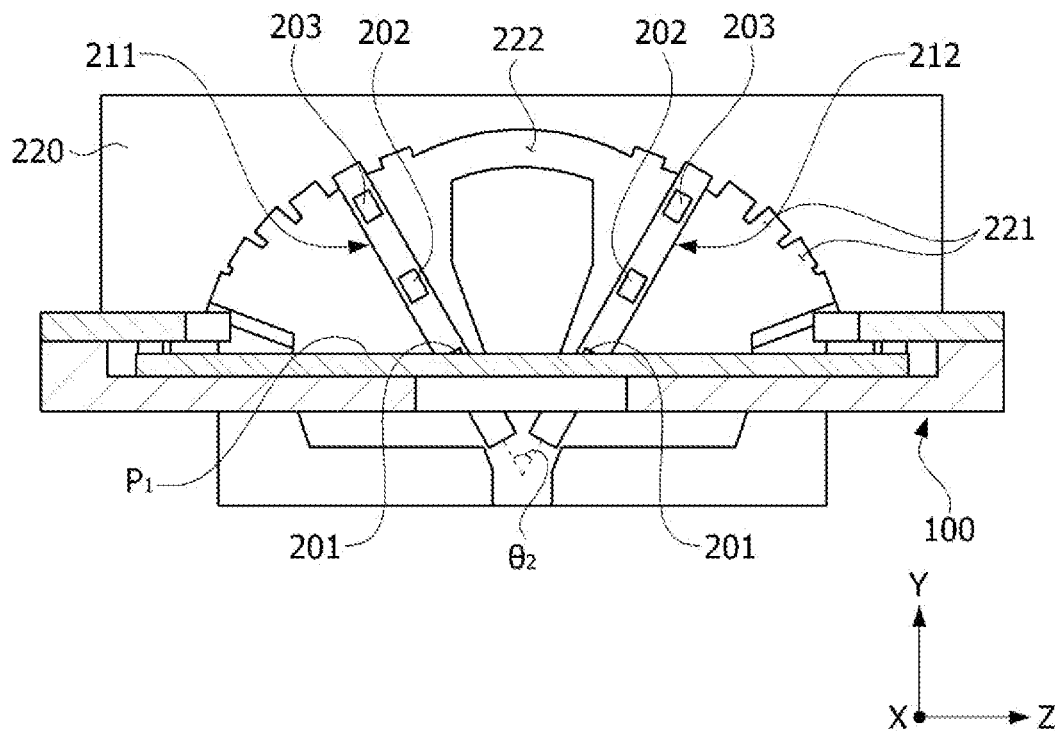
FIG. 5 is a view of the lighting device according to the embodiment of the present invention viewed from above.
Figure 6:
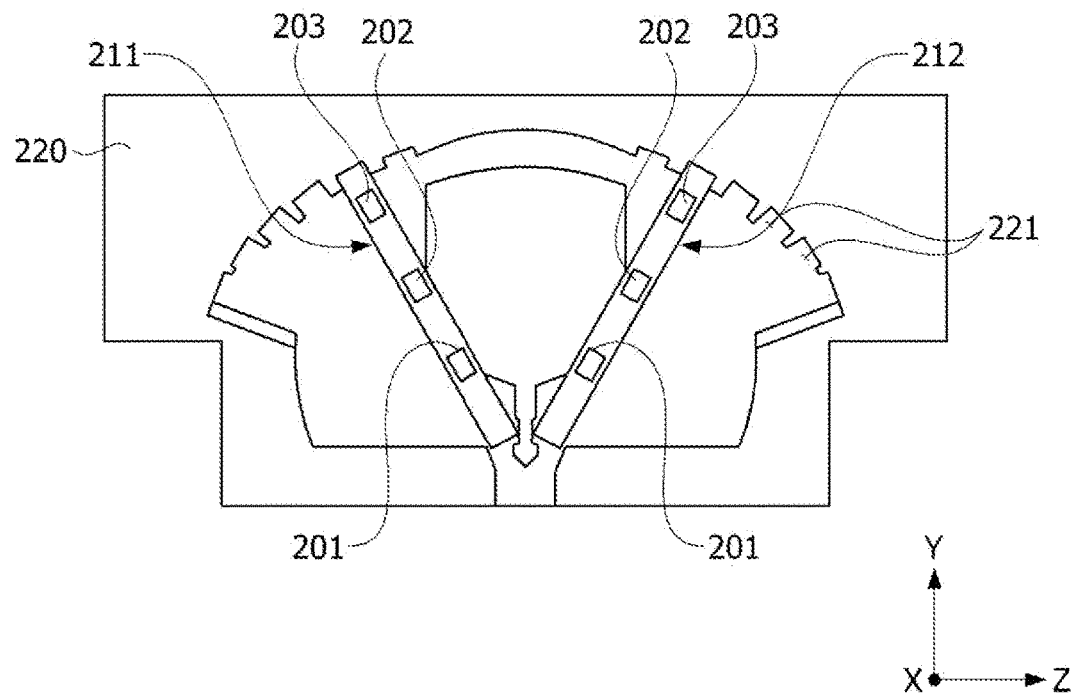
FIG. 6 is a view illustrating a state in which a light conversion module is removed in FIG. 5.

FIG. 4 is a picture of the lighting device according to the embodiment of the present invention viewed from the front, FIG. 5 is a view of the lighting device according to the embodiment of the present invention viewed from the above, and FIG. 6 is a view illustrating a state in which the light conversion module is removed in FIG. 5.

Referring to FIGS. 4 to 6, the light source module 200 includes a first circuit board 211 and a second circuit board 212 disposed on a second base substrate 220. A semicircle-shaped groove 222 is formed in the second base substrate 220 and slits 221 to which the circuit board is fixed are formed in an outer circumferential surface of the groove 222. Accordingly, an angle 82 between the first circuit board 211 and the second circuit board 212 may be adjusted.

The plurality of light emitting elements 201, 202, and 203 may be disposed on each of the first circuit board 211 and the second circuit board 212. In this case, the first light emitting element 201 of each of the first circuit board 211 and the second circuit board 212 may be disposed at side surfaces of the light conversion module 100. Further, the second and third light emitting elements may be disposed higher than one surface P1 of the light conversion module 100 in the first direction (the Y direction).

In this case, the second and third light emitting elements 202 and 203 may be disposed higher than the light conversion module 100 to implement linear light having a curved line different from that of the linear light generated by the first light emitting element 201.

Figure 7A:
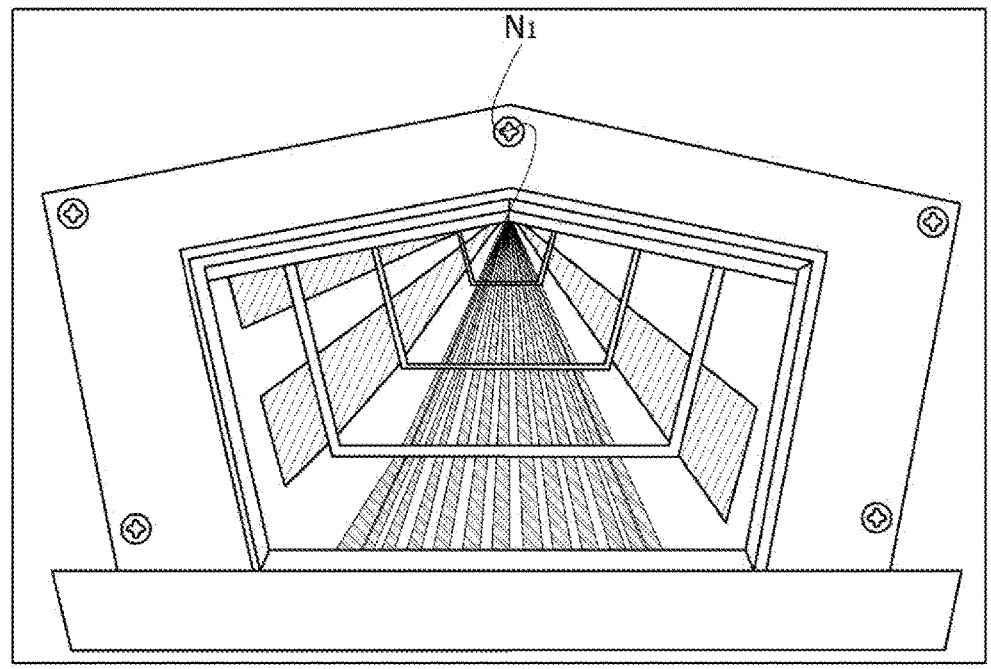
FIG. 7A is a picture of a stereoscopic image implemented by the lighting device according to the embodiment of the present invention viewed from the front.
Figure 7B:
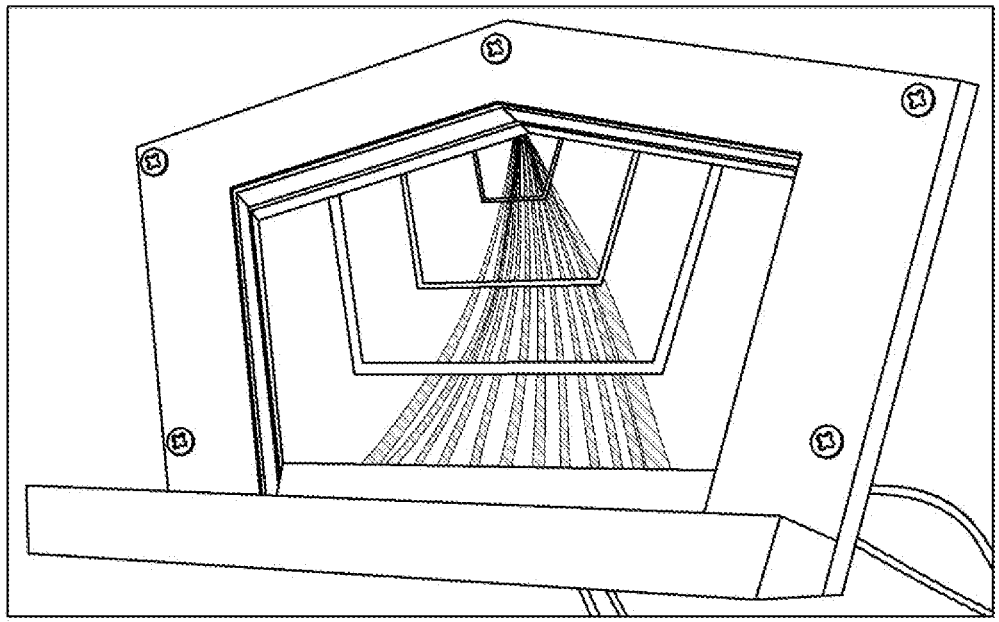
FIG. 7B is a picture of the stereoscopic image implemented by the lighting device according to the embodiment of the present invention viewed from a right side.
Figure 7C:
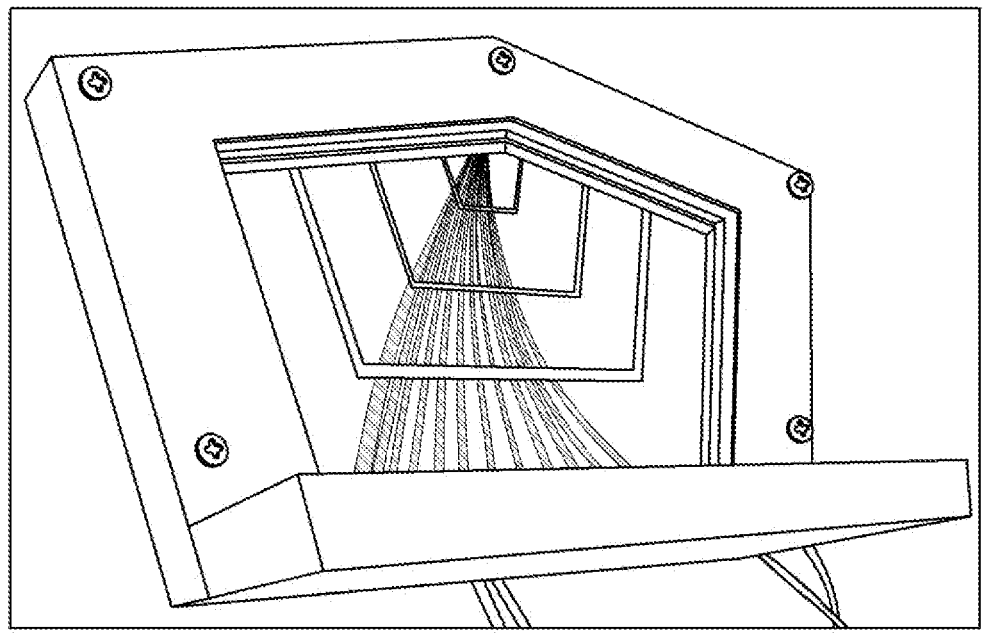
FIG. 7C is a picture of the stereoscopic image implemented by the lighting device according to the embodiment of the present invention viewed from a left side.

FIG. 7A is a picture of the stereoscopic image implemented by the lighting device according to the embodiment of the present invention viewed from the front, FIG. 7B is a picture of the stereoscopic image implemented by the lighting device according to the embodiment of the present invention viewed from the front, and FIG. 7C is a picture of the stereoscopic image implemented by the lighting device according to the embodiment of the present invention viewed from the front.

Referring to FIGS. 7A to 7C, the light emitted from the plurality of light emitting elements 201, 202, and 203 may form stereoscopic light that is bent upward and converged at an upper center end N1. The stereoscopic image may be more stereoscopic when observed from the side.

Figure 8:
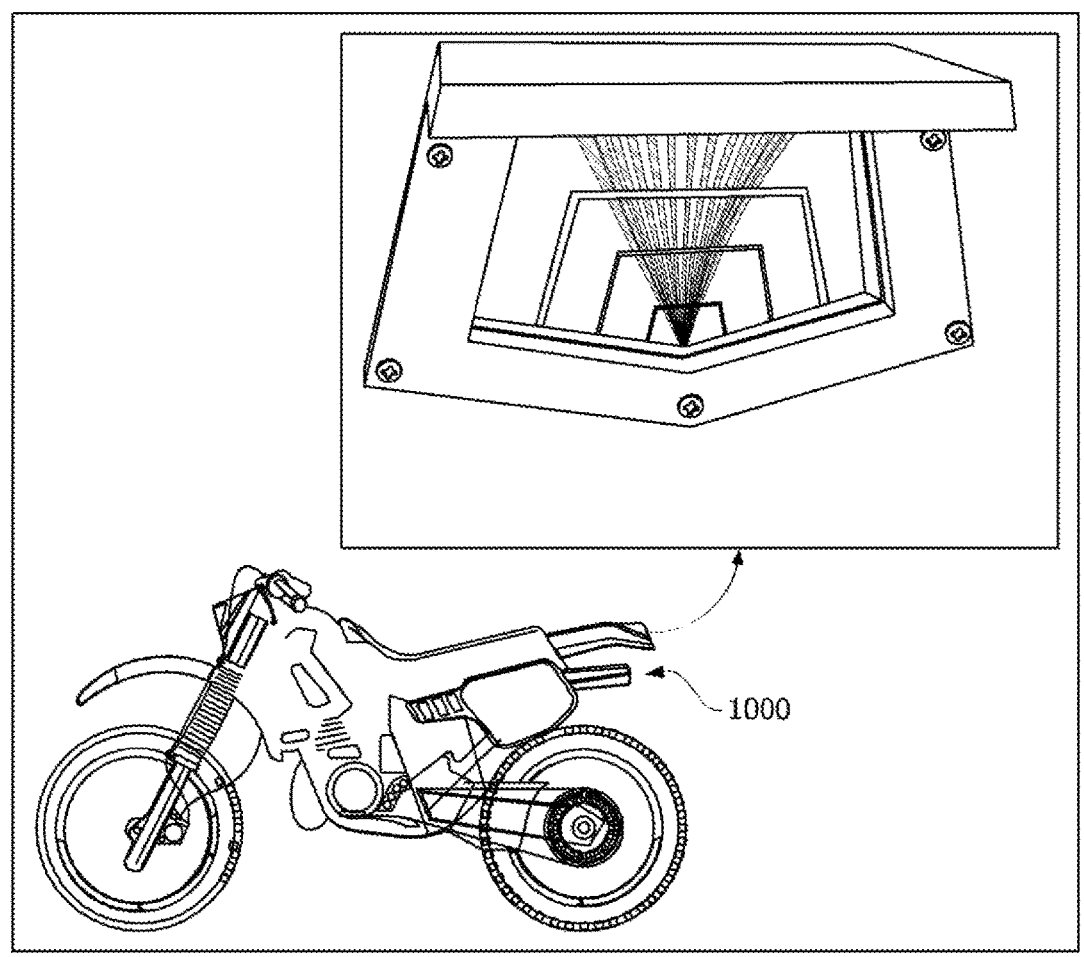
FIG. 8 is a view illustrating a rear lamp of a motorcycle according to the embodiment of the present invention.

FIG. 8 is a view illustrating a rear lamp of a motorcycle according to the embodiment of the present invention.

The lighting device of the embodiment is not limited to lighting of a vehicle and may be applied to applied to inner and outer curved surface portions or curved portions of an target in which lighting is installed such as a building, a facility, furniture, or the like as a flexible film-shaped lighting device. In this case, an outer lens 510 may be an optical guide part, an optical member in which the optical guide part, a stereoscopic effect forming part, and a reflection part are combined and/or a supporting member configured to support a light source part, or a housing. In this case, the outer lens 510 may have a light transmission rate or transparency which is greater than or equal to a predetermined level so that the inside thereof is seen from the outside.

Referring to FIG. 8, the lighting device of the embodiment may serve as a tail lamp of a two-wheeled vehicle (a motorcycle 1000).

Figure 9:
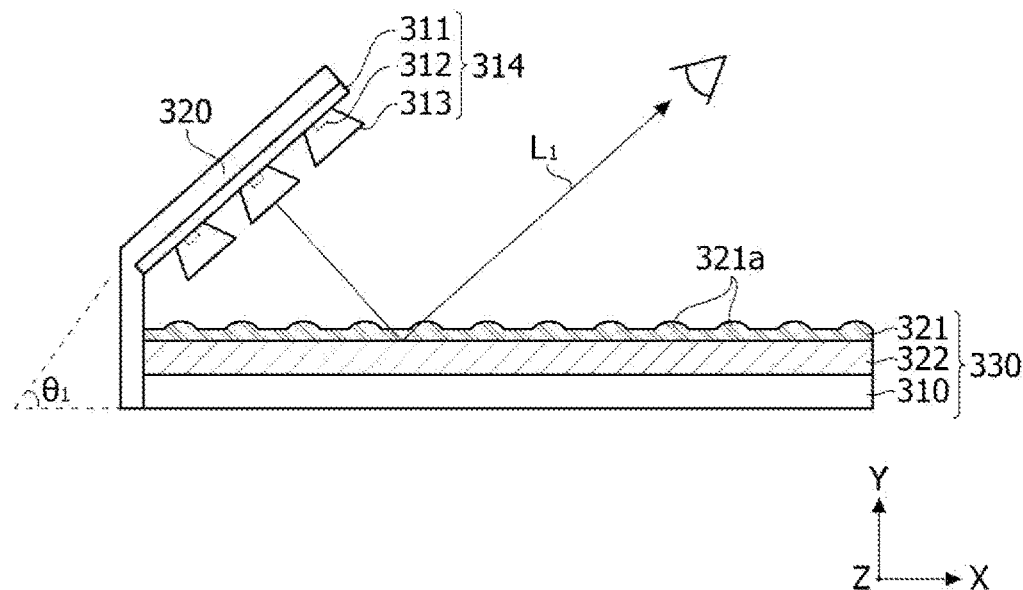
FIG. 9 is a conceptual diagram of the lighting device according to the embodiment of the present invention.
Figure 10:
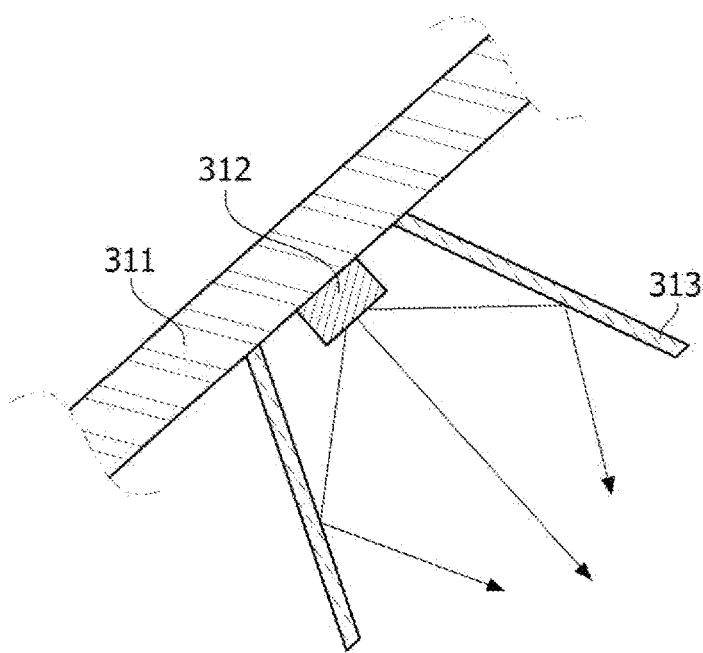
FIG. 10 is a cross-sectional view of a light source part in FIG. 9.
Figure 11:
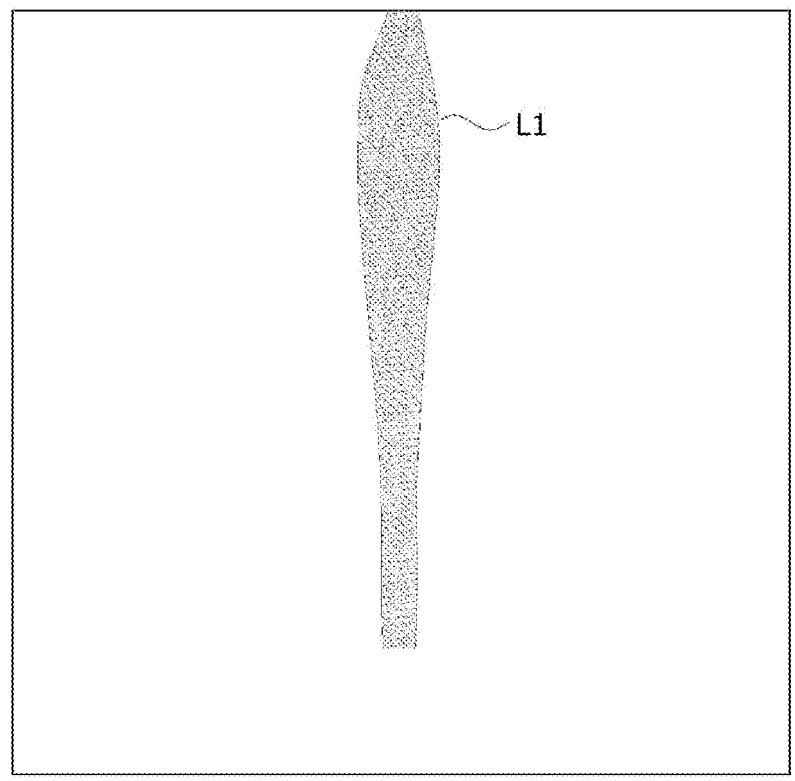
FIG. 11 is an image of the linear light emitted from the lighting device in FIG. 9.
Figure 12:
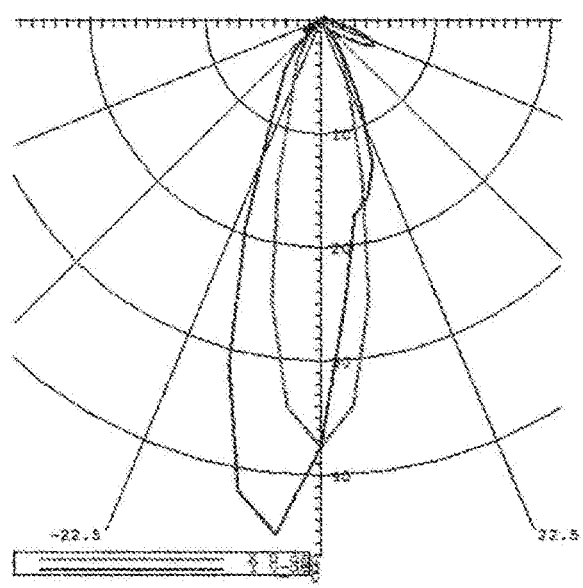
FIG. 12 is a view illustrating a beam angle of the light emitted from the lighting device in FIG. 9.
Figure 13:
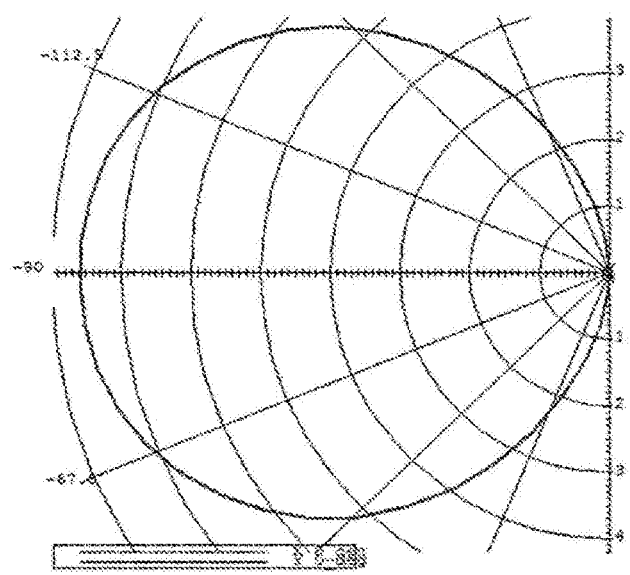
FIG. 13 is a view illustrating a beam angle of the light emitted from the light emitting element in FIG. 9.

FIG. 9 is a conceptual diagram of the lighting device according to the embodiment of the present invention, FIG. 10 is a cross-sectional view of the light source part in FIG. 9, FIG. 11 is an image of the linear light emitted from the lighting device in FIG. 9, FIG. 12 is a view illustrating a beam angle of the light emitted from the lighting device in FIG. 9, and FIG. 13 is a view illustrating a beam angle of the light emitted from the light emitting element in FIG. 9.

Referring to FIGS. 9 and 10, the lighting device according to the embodiment includes a first plate 310, a second plate 320, a converting part 330 disposed on the first plate 310, and a light source part 314 disposed on the second plate 320 to emit light toward the converting part 330.

Structures of the first plate 310 and the second plate 320 are not particularly limited as long as they are capable of supporting the converting part 330 and the light source part 314. For example, the first plate 310 and the second plate 320 may be brackets of a vehicle lamp but are not necessarily limited thereto. The first plate 310 and the second plate 320 may be integrally manufactured.

The converting part 330 may include a reflection layer 322 disposed on the first plate 310 and an optical pattern layer 321 disposed on the reflection layer 322. The converting part 330 may serve to convert light L1 emitted from the light source to linear light. The linear light may have a cubic effect (depth) in a thickness direction (a Y direction) of the converting part 330. That is, the observer may recognize that a linear image becomes farther away or closer while moving in one direction.

The reflection layer 322 may be disposed on one surface of the first plate 310. The reflection layer 322 may include a material having high reflection efficiency to reflect light emitted from the light source part 314. The lighting device may reduce light loss and more clearly show stereoscopic linear light due to the reflection layer 322.

A synthetic resin dispersedly including a white pigment may be used in the reflection layer 322 to increase the reflection characteristic of light and the characteristic of promoting the dispersion of light. For example, the white pigment may include titanium oxide, aluminum oxide, zinc oxide, a carbonate, barium sulfate, calcium carbonate, or the like. A material of the synthetic resin may include polyethylene terephthalate, polyethylene naphthenate, acryl, polycarbonate, polystyrene, polyolefine, cellulose acetate, weather-resistant vinyl chloride, or the like but is not limited thereto. In another embodiment, the reflection layer 322 may include silver (Ag), aluminum (Al), stainless steel, or the like.

The optical pattern layer 321 may include a plurality of optical patterns 321a configured to extend in a second direction (a Z axis direction) and spaced apart from each other in a third direction (an X axis direction). The optical patterns 321a may be sequentially disposed in the second direction or disposed to be spaced apart from each other at a predetermined interval. The optical patterns 321a may have a semi-cylindrical shape which extends in the second direction (the Z axis direction) but is not necessarily limited thereto. For example, a cross-sectional surface of the optical pattern 321a may have a prism shape.

The light source part 314 may include a substrate 311 disposed on the first plate 310, at least one light emitting element 312 disposed on the substrate 311, and a reflector 313 configured to collect light emitted from the light emitting element 312.

The substrate 311 may be a circuit board capable of applying external power to the light emitting element 312. For example, in the substrate 311, a circuit pattern may be formed in a ceramic body but is not necessarily limited thereto.

The light emitting element 312 may be a light emitting diode or an organic light emitting diode. The light emitting element 312 may emit light having a blue wavelength range, a green wavelength range, or a red wavelength range. Selectively, a wavelength converting layer (not shown) such as a phosphor may be disposed on the light emitting element 312.

An inner angle θ1 between the first plate 310 and the second plate 320 may be in a range of 10° to 80° so that the light emitting element 312 may radiate light to the optical pattern layer 321. When the angle θ1 is less than 10°, the light emitting element 312 is disposed too close to the optical pattern layer 321 and thus the light may not be observed from the outside, and when the angle θ1 is greater than 80°, an optical axis of the light emitting element 312 is not incident on the optical pattern layer 321 and thus the light may not be observed from the outside.

The light emitting elements 312 may be disposed so that the light emitted therefrom may cross the second direction (the Z direction) in which the optical patterns 321a extend. Accordingly, the light emitted from most of the light emitting elements 312 crosses the second direction (the Z direction). The observer observes light which proceeds in the third direction (the X direction) perpendicular to the second direction (the Z direction) among the light emitted from the light emitting elements 312. When intervals of the optical patterns 321a are sufficiently small, the observer may observe a linear image. Referring to FIG. 11, the observer may sense a feeling of depth which becomes farther away from eyes thereof as the distance from the light source increases.

The reflector 313 may serve to collect the light emitted from the light emitting elements 312. According to the embodiment, the light emitted from the light emitting elements 312 may be incident on the optical pattern layer 321 and then reflected to the reflection layer 322 again to be emitted to the outside. In this process, an output of final light may decrease. The above light should satisfy predetermined luminous intensity to serve as a tail lamp or a stop lamp of a vehicle. Accordingly, in the embodiment, the light emitted from the light emitting elements 312 is maximally collected by the reflector 313 to improve luminous intensity.

The reflector 313 may improve the luminous intensity by decreasing the beam angle unlike a reflector 313 of a conventional lamp. For example, in the reflector 313, a ratio between a diameter of a lower end portion (a point close to the substrate) and a diameter of an upper end portion may be in a range of 1:1.2 to 1:3. In the case in which the above is satisfied, the luminous intensity may be increased by decreasing the beam angle.

Referring to FIG. 12, it is measured that a beam angle of the light finally emitted from the lighting device according to the embodiment is less than or equal to 50° (−22.5° to 22.5°), and the luminous intensity is 37.53 cd. On the other hand, referring to FIG. 13, it is measured that a beam angle of light emitted from the light emitting elements 312 not having the reflector is greater than or equal to 120° and the luminous intensity is 7.586 cd. That is, the reflector may convert the light in FIG. 13 to the light in FIG. 12.

According to the embodiment, it may be known that the beam angle is decreased but the luminous intensity is improved by the reflector 313. Accordingly, light distribution regulations of a vehicle may be satisfied using a small amount of LEDs.

Figure 14:
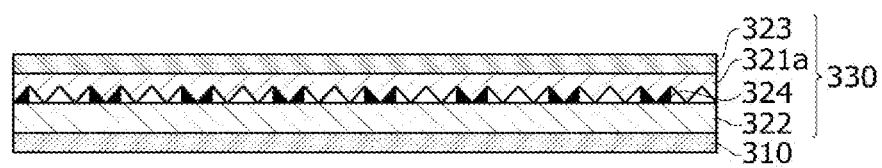
FIG. 14 is a modification of a converting part in FIG. 9.

Referring to FIG. 14, the converting part 330 may include the reflection layer 322 and the optical pattern layer 321 including the plurality of optical patterns 321a. In this case, a separation part 324 may be provided between the reflection layer 322 and the optical pattern layer 321. The separation part 324 may be defined as a vacant space excluding a space in which an adhesive layer is disposed.

The optical pattern layer 321 may include the plurality of optical patterns 321a. Each of the plurality of optical patterns 321a may be convexly formed toward the reflection layer 322 and have an inclined surface. For example, the optical patterns 321a may have a prism shape. The inclined surface may be designed to guide the incident light in a predetermined direction by refraction and regular reflection of the incident light.

Figure 15:
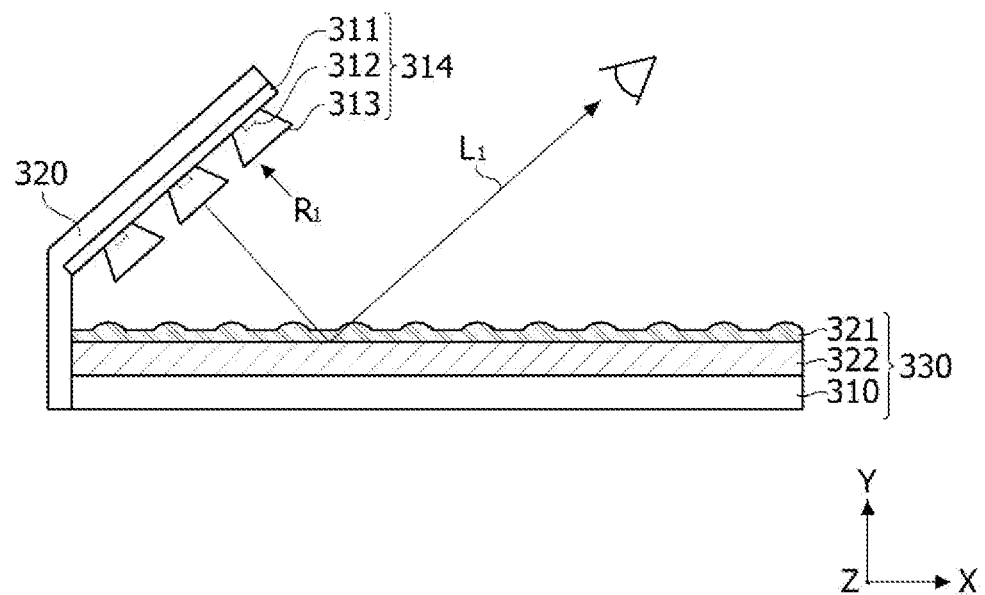
FIG. 15 is a conceptual diagram of a lighting device according to another embodiment of the present invention.
Figure 16:
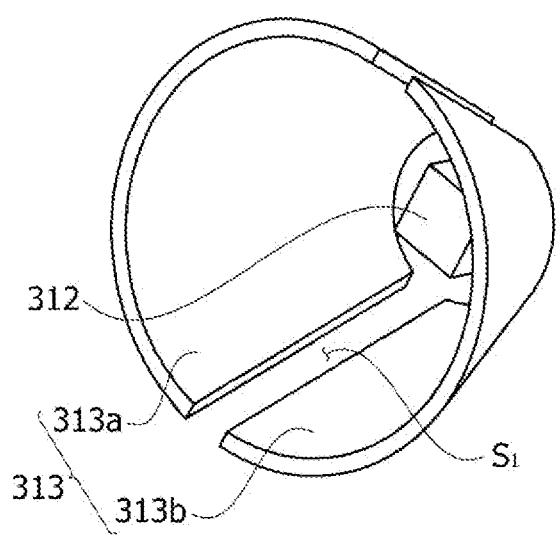
FIG. 16 is a perspective view of a light source part in FIG. 15.

FIG. 15 is a conceptual diagram of a lighting device according to another embodiment of the present invention. FIG. 16 is a perspective view of a light source part in FIG.

Figure 17:
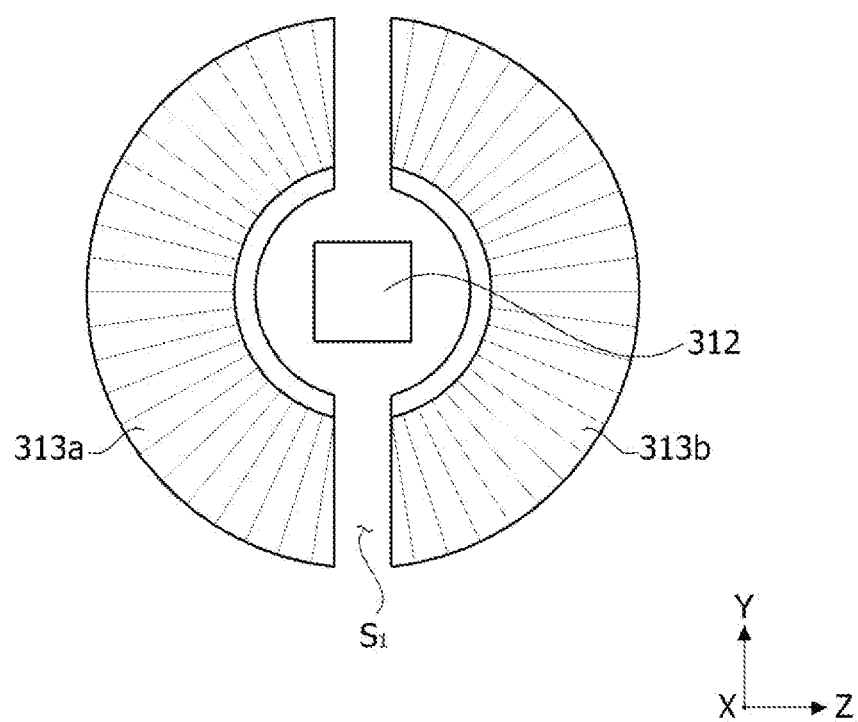
FIG. 17 is a view of the light source part in FIG. 15 viewed from an R1 direction.
Figure 18:
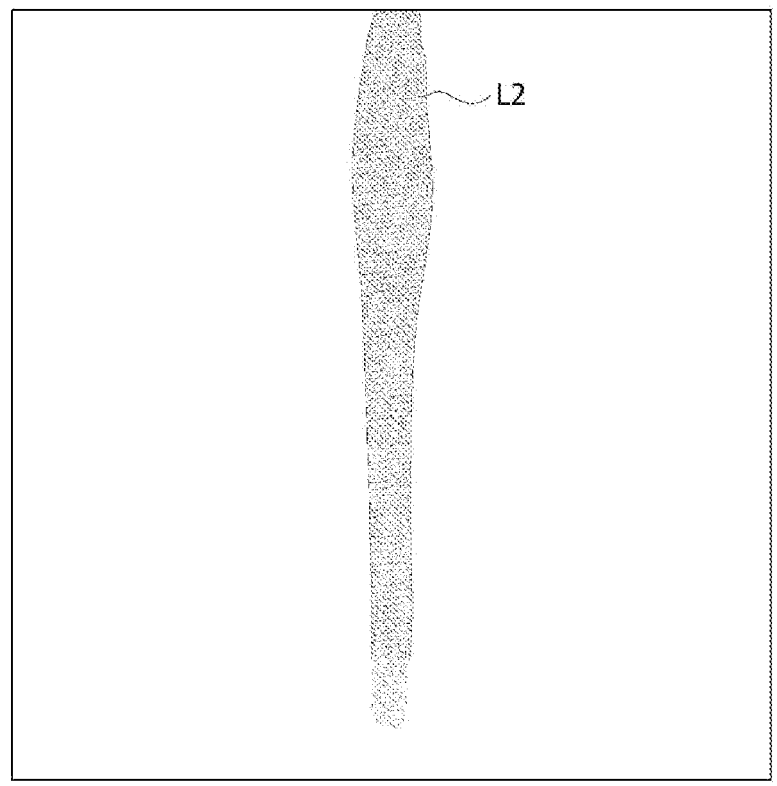
FIG. 18 is an image of linear light emitted from the lighting device in FIG. 15.
Figure 19:
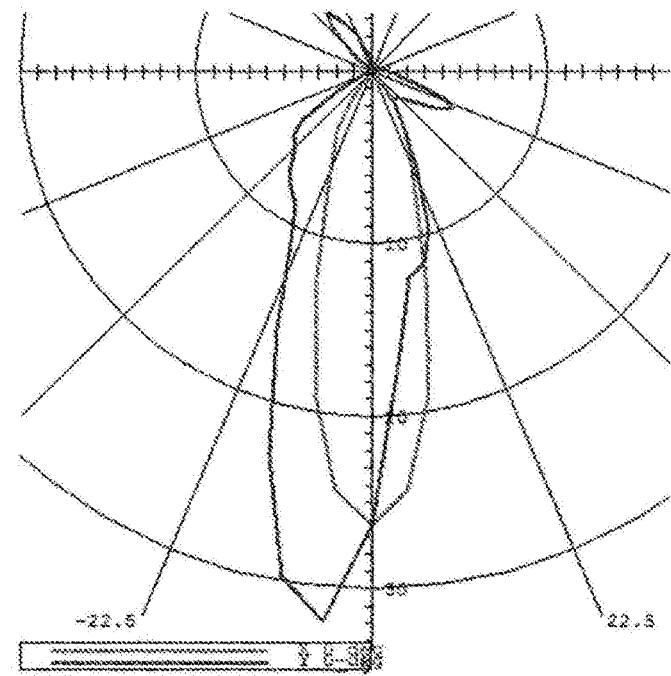
FIG. 19 is a view illustrating a beam angle of the light emitted from the lighting device in FIG. 15.

15. FIG. 17 is a view of the light source part in FIG. 15 viewed from an R1 direction. FIG. 18 is an image of linear light emitted from the lighting device in FIG. 15. FIG. 19 is a view illustrating a beam angle of the light emitted from the lighting device in FIG. 15.

Referring to FIGS. 15 and 16, the lighting device according to another embodiment includes a first plate 310, a second plate 320, a converting part 330 disposed on the first plate 310, and a light source part 314 disposed on the second plate 320 to emit light toward an optical pattern layer 321.

The light source part 314 may include a substrate 311 disposed on the second plate 320, a light emitting element 312 disposed on the substrate 311, and a reflector 313 configured to collect light emitted from the light emitting element 312.

In the reflector 313, a slit S1 may be formed in a direction parallel to a first direction (a Y direction) which is a thickness direction of the first plate 310. Accordingly, the reflector 313 may be divided into first and second reflectors 313a and 113b spaced apart from each other. Light emitted in the direction parallel to the thickness direction among light emitted from the light emitting element 312 may pass through the slit S1 and then be emitted as it is without being reflected by the reflector 313. On the other hand, light emitted in a direction perpendicular to the thickness direction (a Z axis direction) may be collected by the reflector 313 to have improved intensity. Accordingly, linear light having a relatively thick width may be implemented.

Referring to FIG. 17, a ratio between the second direction width (the Z axis direction width) of the light emitting element 312 and a width of the slit S may be in a range of 1:0.8 to 1:3. When the ratio between widths becomes less than 1:0.8 or greater than 1:3, since the intensity of the light emitted in the direction parallel to the thickness direction and the intensity of the light emitted in the direction perpendicular to the thickness direction become similar, the linear light having a thick width may be difficult to be implemented. When the ratio between widths becomes less than 1:0.8 or satisfies 1:3, the linear light having a thick width like FIG. 18 may be implemented.

Figure 20:
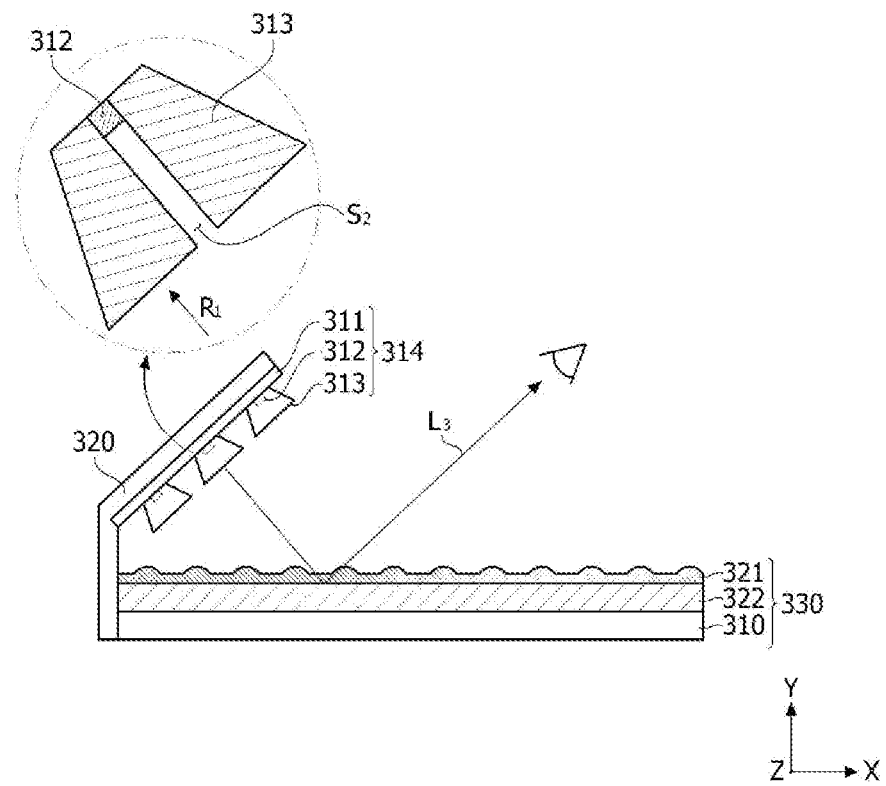
FIG. 20 is a conceptual diagram of a lighting device according to still another embodiment of the present invention.
Figure 21:
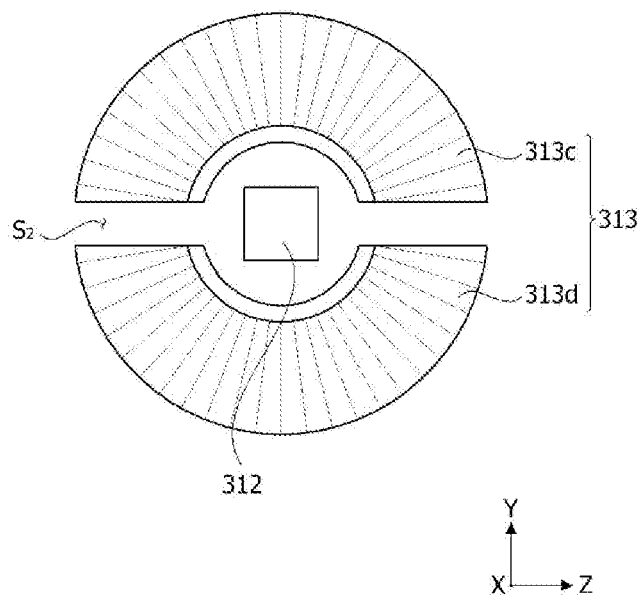
FIG. 21 is a view of a light source part in FIG. 20 viewed from an R1 direction.

FIG. 20 is a conceptual diagram of a lighting device according to still another embodiment of the present invention lighting device. FIG. 21 is a view of a light source part in FIG. 20 viewed from an R1 direction.

In a reflector 313, a slit S2 may be formed in a direction parallel to a second direction (a Z direction). Accordingly, the reflector 313 may be divided into first and second reflectors 313c and 113d spaced apart from each other. Light emitted in the direction parallel to the second direction (the Z direction) among light emitted from a light emitting element 312 may be emitted as it is without being reflected by the reflector 313. On the other hand, light emitted in a direction parallel to a thickness direction may be collected by the reflector 313 to have improved intensity. Accordingly, linear light having a relatively thin width may be implemented.

The lighting device of the embodiment is not limited to a lighting device of a vehicle and may be applied to applied to inner and outer curved surface portions or curved portions of an target in which lighting is installed such as a building, a facility, furniture, or the like as a flexible film-shaped lighting device. In this case, an outer lens may be an optical guide part, an optical member in which the optical guide part, a stereoscopic effect forming part, and a reflection part are combined, and/or a supporting member configured to support a light source part, or a housing. In this case, the outer lens may have a light transmission rate or transparency which is greater than or equal to a predetermined level so that the inside thereof is seen from the outside.

Although preferable embodiments are described and shown in the above to exemplify technical spirit of the present invention, the present invention is not limited to configurations and actions which are shown and described like the above, and those skilled in the art may understand that various appropriate modifications and changes from the present invention may be performed without departing from the scope of the technical spirit. Accordingly, all appropriate modifications and changes and the equivalents should be considered to be within the scope of the present invention.

An embodiment is directed to providing a lighting device capable of adjusting bending of linear light.

Further, the embodiment is directed to providing a stereoscopic lighting device having a small thickness.

In addition, the embodiment is directed to providing a lighting device capable of improving a freedom degree of a product design and securing reliability by allowing a lighting device itself including a printing circuit board or an optical member to have flexibility.

In addition, the embodiment is directed to providing a lighting device capable of implementing an optical image having various-shaped stereoscopic effects in various lighting fields such as normal lighting, design lighting, vehicle lighting, and the like.

In addition, the embodiment is directed to providing a lighting device of which luminous intensity is improved.

In addition, the embodiment is directed to providing a lighting device capable of implementing various-shaped stereoscopic images.

One aspect of the present invention provides a lighting device including: a light conversion module which includes one surface and another surface; and a light source module disposed on a side surface of the light conversion module, wherein the light source module includes a plurality of light emitting elements disposed to be spaced apart from each other in a first direction, the first direction is a thickness direction of the light conversion module, and at least one of the plurality of light emitting elements is disposed higher than the one surface of the light conversion module in the first direction.

The light conversion module may include a base substrate; a light guide layer disposed on the base substrate, and a reflection pattern layer disposed between the base substrate and the light guide layer.

The reflection pattern layer may include a plurality of optical patterns and the plurality of optical patterns may extend in a direction perpendicular to a proceeding direction of light emitted from the plurality of light emitting elements.

The at least one of the plurality of light emitting elements may be disposed to face the side surface of the light conversion module.

Light emitted from the light emitting element located higher than the light conversion module in the first direction may be incident on an upper surface of the light conversion module.

The reflection pattern layer may include a reflection layer disposed between the base substrate and the light guide layer, and an optical layer disposed between the reflection layer and the light guide layer and including a plurality of optical patterns protruding toward the reflection layer.

The lighting device may include a separation part disposed between the reflection layer and the optical layer.

The reflection pattern layer may include an optical layer disposed between the base substrate and the light guide layer and including a plurality of optical patterns, and a reflection layer disposed on the plurality of optical patterns.

The light source module may include a first light source module including a first circuit board and a plurality of light emitting elements disposed on the first circuit board, and a second light source module including a second circuit board and a plurality of light emitting elements disposed on the second circuit board, and an extending direction of each of the first circuit board and the second circuit board may have a predetermined angle.

According to an embodiment, bending of linear light can be adjusted.

Further, a stereoscopic lighting device having a small thickness can be manufactured.

In addition, a flexible lighting device can be manufactured.

In addition, a lighting device capable of implementing an optical image having various-shaped stereoscopic effects in various lighting fields such as normal lighting, design lighting, vehicle lighting, and the like can be manufactured.

In addition, according to the embodiment, luminous intensity can be improved. Accordingly, the embodiment can satisfy light distribution regulations in Europe as a vehicle lamp.

In addition, a lighting device capable of implementing various-shaped stereoscopic images can be manufactured.

Various useful advantages and effects of the present invention are not limited to the above and may be understood relatively easily in a process of describing exemplary embodiments of the present invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
a light conversion module; and
a light source module disposed on a side surface of the light conversion module,
wherein the light source module includes a first light emitting element and a second light emitting element which are spaced apart from each other in a thickness direction of the light conversion module,
wherein the light conversion module includes a reflection layer, and a light guide layer and an optical layer which are disposed on the reflection layer,
wherein the optical layer includes a plurality of patterns protruding toward the reflection layer,
wherein light emitted from the first light emitting element, which is reflected by the reflection layer, passes through the light guide layer to be implemented as a first linear light, and
wherein light emitted from the second light emitting element, which is reflected by the reflection layer, passes through the light guide layer to be implemented as a second linear light having a shape that is different from a shape of the first linear light.

2. The lighting device of claim 1, wherein each of the first linear light and the second linear light has a curvature.

3. The lighting device of claim 2, wherein:
the first linear light includes one end adjacent to the first light emitting element and the other end spaced farthest apart from the first light emitting element;
the second linear light includes one end adjacent to the second light emitting element and the other end spaced farthest apart from the second light emitting element; and
a distance between the one end of the first linear light and the one end of the second linear light is greater than a distance between the other end of the first linear light and the other end of the second linear light.

4. The lighting device of claim 3, wherein the other end of the first linear light overlaps the other end of the second linear light.

5. The lighting device of claim 1, wherein:
the first light emitting element is disposed lower than an upper surface of the light guide layer; and
the second light emitting element is disposed higher than the upper surface of the light guide layer.

6. The lighting device of claim 1, wherein the plurality of patterns extend in a direction perpendicular to a traveling direction of the light emitted from the first light emitting element.

7. The lighting device of claim 1, wherein:
the light conversion module further includes a first base substrate which is disposed below the reflection layer;
the light source module includes a second base substrate disposed at an angle with respect to the first base substrate and includes a substrate disposed on the second base substrate; and
the first light emitting element and the second light emitting element are mounted on the substrate.

8. The lighting device of claim 7, wherein the second base substrate is disposed perpendicular to the first base substrate.

9. The lighting device of claim 7, wherein:
the second base substrate includes a first area disposed perpendicular to the first base substrate and a second area extending from the first area; and
each of the first area and the second area is disposed at a predetermined angle.

10. The lighting device of claim 9, wherein the substrate is disposed in the second area of the second base substrate.

11. The lighting device of claim 1, further comprising a separation part disposed between the reflection layer and the optical layer.

12. The lighting device of claim 1, further comprising an adhesive layer disposed between the reflection layer and the optical layer.

13. The lighting device of claim 1, wherein each of the plurality of patterns has a prism shape.

14. The lighting device of claim 1, further comprising:
a first reflector configured to collect the light emitted from the first light emitting element; and a second reflector configured to collect the light emitted from the second light emitting element,
wherein each of the first reflector and the second reflector includes a slit formed in a direction parallel to the thickness direction.

15. The lighting device of claim 14, wherein a ratio of a width of the first light emitting element to a width of the slit ranges from 1:0.8 to 1:3.

16. A lamp comprising:
a lighting device configured to emit linear light; and
an outer lens configured to cover the lighting device,
wherein the lighting device includes:
  a light conversion module; and
  a light source module disposed on a side surface of the light conversion module,
  the light source module includes a first light emitting element and a second light emitting element which are spaced apart from each other in a thickness direction of the light conversion module,
  the light conversion module includes a reflection layer, and a light guide layer and an optical layer which are disposed on the reflection layer,
  the optical layer includes a plurality of patterns protruding toward the reflection layer,
  light emitted from the first light emitting element, which is reflected by the reflection layer, passes through the light guide layer to be implemented as a first linear light, and
  light emitted from the second light emitting element, which is reflected by the reflection layer, passes through the light guide layer to be implemented as a second linear light having a shape that is different from a shape of the first linear light.

17. The lamp of claim 16, wherein each of the first linear light and the second linear light has a curvature.

18. The lamp of claim 17, wherein:
the first linear light includes one end adjacent to the first light emitting element and the other end spaced farthest apart from the first light emitting element;
the second linear light includes one end adjacent to the second light emitting element and the other end spaced farthest apart from the second light emitting element; and
a distance between the one end of the first linear light and the one end of the second linear light is greater than a distance between the other end of the first linear light and the other end of the second linear light.

19. The lamp of claim 18, wherein the other end of the first linear light overlaps the other end of the second linear light.

20. The lamp of claim 16, wherein:
the first light emitting element is disposed lower than an upper surface of the light guide layer; and
the second light emitting element is disposed higher than the upper surface of the light guide layer.

* * * * *